United States Patent [19]

Chang et al.

[11] Patent Number: 5,979,033
[45] Date of Patent: Nov. 9, 1999

[54] METHOD OF RECYCLING WASTE PRINTED CIRCUIT BOARDS

[75] Inventors: Kuo-Ching Chang, Kaohsiung; Sen-Chi Lee, Ilan Hsien; Chin-Chih Tai, Kaohsiung Hsien, all of Taiwan

[73] Assignee: Cleanevi' Engineering Consultant Co., Ltd., Kaohsiung Hsien, Taiwan

[21] Appl. No.: 09/072,136

[22] Filed: May 5, 1998

[51] Int. Cl.⁶ .......................... B02C 17/00; B02C 19/12
[52] U.S. Cl. ................. 29/403.4; 29/403.1; 29/403.3; 241/23; 241/DIG. 38
[58] Field of Search .................. 29/403.1, 403.3, 29/403.4; 241/23, 24.13, 24.18, DIG. 38

[56] References Cited

U.S. PATENT DOCUMENTS

| | | |
|---|---|---|
| 2,238,367 | 4/1941 | Mohr et al. . |
| 2,704,707 | 3/1955 | Lemeshka . |
| 3,210,182 | 10/1965 | Funari . |
| 3,632,336 | 1/1972 | Cameron . |
| 3,794,482 | 2/1974 | Anderson et al. . |
| 3,933,981 | 1/1976 | Wakefield et al. . |
| 4,086,083 | 4/1978 | Michael et al. . |
| 4,631,183 | 12/1986 | Lalancette et al. . |
| 4,874,486 | 10/1989 | Hanulik . |
| 5,678,775 | 10/1997 | Chapman . |
| 5,683,040 | 11/1997 | Jakob et al. . |
| 5,704,557 | 1/1998 | Hallett et al. . |
| 5,759,416 | 6/1998 | Bosman et al. . |
| 5,843,287 | 12/1998 | Wicks et al. . |

FOREIGN PATENT DOCUMENTS

| | | | |
|---|---|---|---|
| 292 676 | 8/1991 | Germany | 241/23 |
| 2218-486 | 8/1990 | Japan | 241/DIG. 38 |

*Primary Examiner*—David P. Bryant
*Assistant Examiner*—John Preta
*Attorney, Agent, or Firm*—Rosenberg, Klein & Bilker

[57] ABSTRACT

A method and a device for treating waste printed circuit boards with molten tin include process of throwing printed circuit boards into a molten tin bath in treating furnace, letting the boards proceed crashing, stirring and carbonizing treatment for separating copper foil, thermosetting plastic and glass fiber. Then these three kinds of materials are respectively separated from each other by taking advantage of their different specific gravity and collected in separate tanks to recover copper and other metals from the waste printed circuit boards.

1 Claim, 2 Drawing Sheets

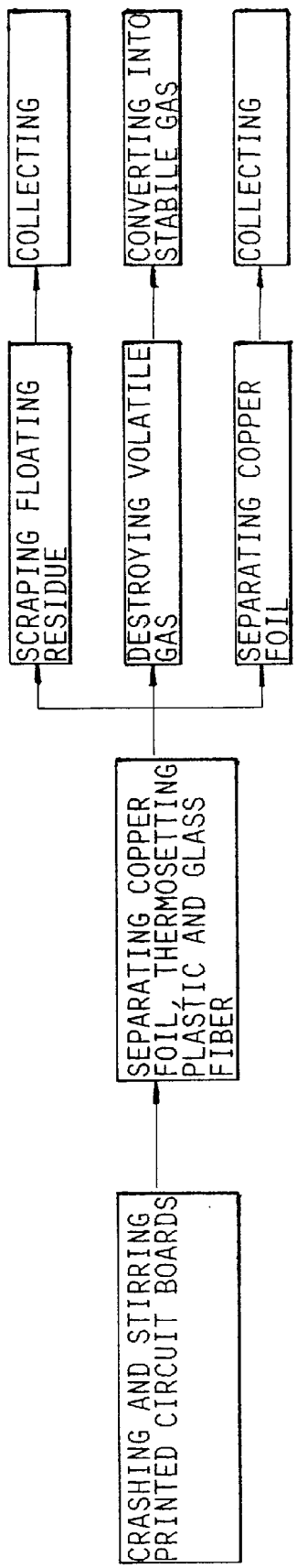
F I G. 1

METHOD OF RECYCLING WASTE PRINTED CIRCUIT BOARDS

BACKGROUND OF THE INVENTION

This invention relates to a method and a device for treating waste printed circuit boards with molten tin or its alloy, particularly to one adapted to recover copper and other metals from waste printed circuit boards.

Disqualified printed circuit boards may be made not a little in their manufacturing process, and besides, good printed circuit boards will become useless and be discarded after a long period of use or become old-style to be displaced with new ones. Then waste printed circuit boards should have to be treated with special methods, otherwise they never fail to pollute our living environment.

However, printed circuit boards used in industries may have multiple metal layers, which are very difficult to be stripped off. So, various methods such as incineration, crush, pickling, floatation, solidification thermal cracking, etc. are in use for treating discarded printed circuit boards. Nevertheless, none of these methods are quite ideal, too complicated to result in high cost in treatment.

SUMMARY OF THE INVENTION

The main purpose of the invention is to offer a method and a device for treating waste printed circuit boards with molten tin or its alloy, by throwing them into a molten tin bath in treating furnace to proceed carbonizing, crashing and stirring action for separating and collecting copper foil, thermosetting plastic and glass fiber in them.

Another purpose of the invention is to offer a easier method and a simpler device for treating waste printed circuit boards.

One more purpose of the invention is to offer a method forcing copper foil easily separate from printed circuit boards.

BRIEF DESCRIPTION OF DRAWINGS

This invention will be better understood by referring to the accompany drawings, wherein:

FIG. 1 is a flow chart of a method for treating waste printed circuit boards of the present invention; and, FIG. 2 is a simplified schematics of a device for treating waste printed circuit boards of the present invention.

DETAILED DESCRIPTION OF THE PREFERRED EMBODIMENT

Figure 2:
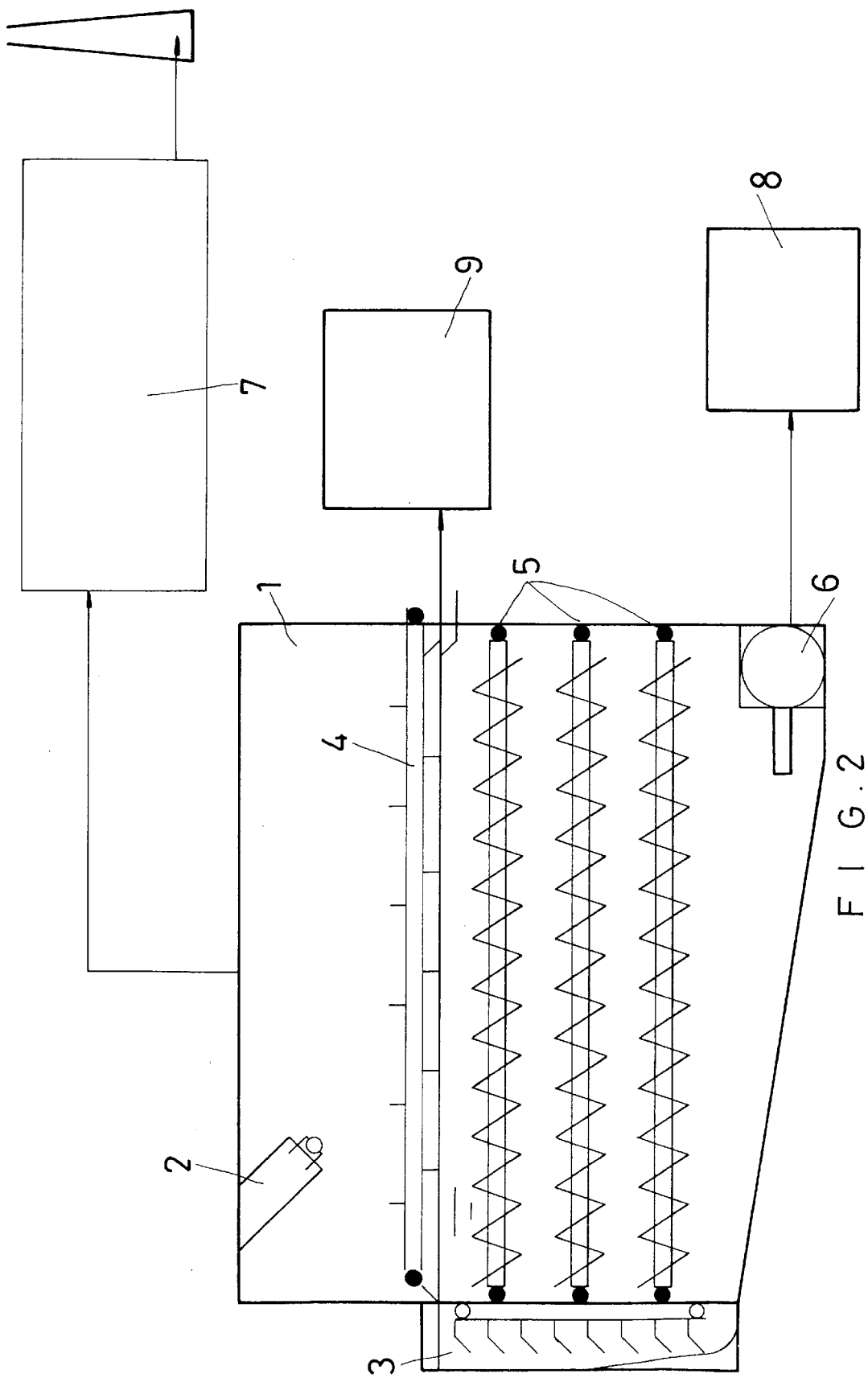

A preferred method for treating waste printed circuit boards with molten tin or its alloy in the present invention, as shown in FIG. 1, includes the following processes.

1. The waste printed circuit boards are thrown into a molten tin bath in treating furnace 1, forcing copper foil and plastic attached on the waste printed circuit boards contact sufficiently with molten tin in the furnace 1, and then performing crashing and stirring the waste printed circuit boards so as to separate the copper foil from the waste printed circuit boards, and at the same time to carbonize thermosetting plastic in the waste printed circuit boards.

2. Next; carbonized the waste printed circuit boards are continued to be stirred, forcing the copper foil, the thermosetting plastic and the glass fibers to completely separate from one another, as they respectively. have different specific gravity.

2-1-1. Then firstly the copper foil are settled down to the bottom, and carbonized the thermosetting plastic residues and the glass fiber floated on an upper surface on the molten tin bath is scraped off with a scraping device 3.

2-1-2. Scraped the carbonized thermosetting plastic residues and the glass fiber are collected in a collect tank 9.

2-2-1. Volatile gas produced in the carbonizing process of the thermosetting plastic of the waste the waste printed circuit boards is to be burned and destroyed with a burning device 2.

2-2-2. The volatile gas not completely destroyed by the burning device 2 is led into a combustion camber 7 located outside the furnace 1 and chemically tansformed into stabile gas.

2-3-1. The copper foil separated from the thermosetting plastic and the glass fiber is removed at regular internals and in a fixed amount.

2-3-2. The copper foil removed is collected in a metal collect tank 8.

The device adapted to treat the waste printed circuit boards with molten tin or its alloy is shown in FIG. 2, consist of a molten tin treating furnace 1, a burning device 2, a feeding device 3, several units of crashing and Stirring devices 4, a float scraping device 5, a separating device 6, a combustion chamber 7, a metal collect tank 8 and a float collect tank 9.

The burning device 2 is installed inside the molten tin treating furnace 1 for heating and melting tin placed in the furnace 1 and for burning volatile gas produced in carbonizing thermosetting plastic as well.

The feeding device 3 is fixed in one end of the furnace 1, consisting of a sucking pump and guide plates to guide the waste printed circuit boards into the furnace 1.

The several units of crashing and stirring devices 4 are arranged in the furnace 1, for crashing and stirring the waste printed circuit boards in the furnace 1, increasing contact surface of the waste printed circuit boards with the molten tin.

The float scraping device 5 is also disposed in an upper portion of the furnace 1, and connected with a float collect tank 9 placed outside the furnace 1 for scraping floating carbonized thermosetting plastic residues and the glass fiber, and then sending them into the collect tank 9.

The separating device 6 is placed on the bottom of the furnace 1, made of a filter net or a pump, and connected with the metal collect tank 8, for separating the copper foil settling down on the bottom of the furnace 1 and sending it into the metal collect tank 8.

The combustion chamber 7 is located outside the furnace 1, and connected with each other for leading the volatile gas incompletely burned and not yet destroyed by the burning device 2 into the combustion chamber 7 after carbonizing process of the thermosetting plastic so that incompletely combusted volatile gas may be burned again therein to become become stabile gas to be exhausted through subsequent air pollution control devices before being discharged to the atmosphere.

The method and the device for treating the waste printed circuit boards have the following advantages.

1. It is a non-combustion reaction, no need to supply air or oxygen, saving energy for heating air. And thus, there is no concern about whether combustion is complete or not, with operating conditions, such as temperature and residence time, possible to be in a wide scope.

2. It does not need air or oxygen, so waste gas is only volatile gas produced as thermosetting plastic carbonized, saving expense and space for the device for treating waste gas, which is diminished a great deal in this device.

3. Crashing and stirring process can force molten tin sufficiently contact with the waste printed circuit boards, augmenting dimensions of mutual contact of the both.

4. As thermosetting plastic is carbonized, permitting multiple layers of the waste printed circuit boards peel off and separate from one another so that the copper foil contained inside the layers may separate from the plastic and the glass fiber.

5. Volatile gas hardly escape from the furnace 1, and can be led into the combustion chamber 7 for being burned completely to be to totally destroyed.

6. The copper foil contained in the waste printed circuit boards is not oxidized and can be recycled with minimum cost, by means of non-combustion reaction, simplifying subsequent treating processes.

While the preferred embodiment of the invention has been described above, it will be recognized and understood that various modifications may be made therein and the appended claims are intended to cover all such modifications which may fall within the spirit and scope of the invention.

What is claimed is:

1. A method for recycling waste printed circuit boards having copper foil, thermosetting plastic, and glass fiber, the method comprising the steps of:

placing said waste printed circuit boards into a molten tin or tin alloy bath, wherein the waste printed circuit boards are subjected to crashing and stirring said waste printed circuit boards while they are in the tin bath so as to force the copper foil to peel off said waste printed circuit boards, and wherein the thermosetting plastic in said waste printed circuit boards is carbonized at the same time;

continuing to subject the waste printed circuit boards to crashing and stirring after the thermosetting plastic has carbonized, in order to separate the copper foil, thermosetting plastic, and the glass fiber from each other;

removing by means of a floating scraping device the carbonized thermosetting plastic residues and said glass fiber floating on an upper surface of the molten tin bath;

storing the removed carbonized thermosetting plastic residues and glass fiber in separate collection tanks;

utilizing a burning device to destroy the volatile gas produced during the carbonizing of said thermosetting plastic;

utilizing a combustion chamber to destroy any remaining volatile gas after the volatile gas is led into the combustion chamber, wherein said volatile gas is burned and transformed into a stable gas;

removing the separated copper foil at regular intervals and in a fixed amount; and, storing the removed copper foil in a metal collection tank.

* * * * *